United States Patent [19]
Herd et al.

[11] Patent Number: 5,363,077
[45] Date of Patent: Nov. 8, 1994

[54] MRI MAGNET HAVING A VIBRATION-ISOLATED CRYOCOOLER

[75] Inventors: Kenneth G. Herd, Niskayuna; Evangelos T. Laskaris, Schenectady; Thompson Paul S., Stephentown, all of N.Y.

[73] Assignee: General Electric Company, Schenectady, N.Y.

[21] Appl. No.: 188,878

[22] Filed: Jan. 31, 1994

[51] Int. Cl.[5] .................... H01F 1/00; F25B 19/00
[52] U.S. Cl. .................... 335/216; 62/51.1; 62/295; 62/297
[58] Field of Search ............ 335/216; 62/51.1, 295, 62/297, 6; 417/901

[56] References Cited

U.S. PATENT DOCUMENTS

| | | | |
|---|---|---|---|
| Re. 33,419 | 11/1990 | White | 62/51.1 |
| 4,833,899 | 5/1989 | Tugal | 62/55.5 |
| 4,862,697 | 9/1989 | Tugal | 62/55.5 |
| 4,876,413 | 10/1989 | Vermilyea | 174/15.4 |
| 4,924,198 | 5/1990 | Laskaris | 335/216 |
| 4,926,647 | 5/1990 | Dorri | 62/51.1 |
| 4,930,318 | 6/1990 | Brzozowski | 62/51.1 |
| 5,111,665 | 5/1992 | Ackermann | 62/6 |
| 5,129,232 | 7/1992 | Minas et al. | 62/51.1 |
| 5,153,546 | 10/1992 | Laskaris | 335/216 |
| 5,216,889 | 6/1993 | Herd et al. | 62/51.1 |
| 5,222,366 | 6/1993 | Herd et al. | 62/51.1 |
| 5,301,507 | 4/1994 | Laskaris | 62/51.1 |

FOREIGN PATENT DOCUMENTS

| | | | |
|---|---|---|---|
| 2423301 | 1/1975 | Germany | 62/51.1 |
| 2233750 | 1/1991 | United Kingdom | 62/51.1 |

*Primary Examiner*—Leo P. Picard
*Assistant Examiner*—Stephen T. Ryan
*Attorney, Agent, or Firm*—Douglas E. Erickson; Paul R. Webb, II

[57] ABSTRACT

A magnetic resonance imaging magnet includes a cryocooler penetration assembly and a superconducting coil assembly. The cryocooler penetration assembly has a thermal station within a thermal box within a vacuum vessel. The superconducting coil assembly has a magnet cartridge within a thermal shield within a vacuum enclosure. A flexible bellows hermetically connects the vacuum vessel and the vacuum enclosure. A first rigid thermal busbar is rigidly attached to the thermal shield, and a first flexible thermal busbar thermally connects the thermal box and the first rigid thermal busbar. A second rigid thermal busbar is rigidly attached to the magnet cartridge, and a second flexible thermal busbar thermally connects the second rigid thermal busbar and the thermal station. The weight of the cryocooler penetration assembly is supported independent of the superconducting coil assembly which, together with the flexible connections, isolates the vibrations of the cryocooler coldhead (which is attached to the cryocooler penetration assembly) from the superconducting coil assembly thereby improving imaging quality.

10 Claims, 3 Drawing Sheets

MRI MAGNET HAVING A VIBRATION-ISOLATED CRYOCOOLER

BACKGROUND OF THE INVENTION

The present invention relates generally to a cryocooler-cooled superconductive magnet used to generate a uniform magnetic field as part of a magnetic resonance imaging (MRI) diagnostic system, and more particularly to such a magnet having cryocooler coldhead vibrations isolated from the magnetic coil assembly.

MRI systems employing superconductive magnets are used in various fields such as medical diagnostics. Known designs include cryocooler-cooled superconductive magnets wherein the cryocooler coldhead is supported by the superconducting coil assembly through a cryocooler penetration assembly and wherein cold portions of the cryocooler coldhead are thermally connected to cold portions of the superconducting coil assembly through cold portions of the cryocooler penetration assembly using a flexible connection to reduce the transfer of vibrations of the cryocooler coldhead to the superconducting coil assembly, such transferred vibrations inducing eddy currents which degrade the quality of the images obtained. Known designs of MRI superconductive magnets also include open magnets which employ two spaced-apart superconducting coil assemblies with the space between the assemblies allowing for access by medical personnel for surgery or other medical procedures during MRI imaging. What is needed is an MRI magnet design which further minimizes the transfer of cryocooler coldhead vibrations to the superconducting coil assembly to avoid the necessity of medical personnel shutting down the cryocooler to obtain precise images, such shutting down of the cryocooler leading to quenching of the superconductive magnet.

SUMMARY OF THE INVENTION

It is an object of the invention to provide a cryocooler-cooled MRI magnet which minimizes the transfer of vibrations from the cryocooler coldhead to the superconducting coil assembly.

The magnetic resonance imaging magnet of the invention includes a cryocooler penetration assembly and a first superconducting coil assembly. The cryocooler penetration assembly has a thermal station, a thermal box generally spaced apart from and generally surrounding the thermal station, and a vacuum vessel generally spaced apart from and generally surrounding the thermal box. The first superconducting coil assembly has a magnet cartridge, a thermal shield generally spaced apart from and generally surrounding the magnet cartridge, and a vacuum enclosure generally spaced apart from and generally surrounding the thermal shield. A flexible bellows surrounds a vacuum vessel opening and a vacuum enclosure opening hermetically connecting the vacuum vessel and the vacuum enclosure. A first rigid thermal busbar surrounds a thermal shield opening and is rigidly attached to the thermal shield. A first flexible thermal busbar thermally connects the thermal box and the first rigid thermal busbar. A second rigid thermal busbar is rigidly attached to the magnet cartridge. A second flexible thermal busbar thermally connects the second rigid thermal busbar and the thermal station. Preferably the cryocooler penetration assembly is placed on the floor or otherwise located such that its weight is supported independent of the first superconducting coil assembly.

Several benefits and advantages are derived from the invention. Having the weight of the cryocooler penetration assembly supported independent of the first superconducting coil assembly and having the flexible bellows connection between the cryocooler penetration assembly's room-temperature vacuum vessel and the first superconducting coil assembly's room-temperature vacuum enclosure minimizes the transfer of vibrations from the cryocooler coldhead (which is attached to the cryocooler penetration assembly) to the superconducting coil assembly's vacuum enclosure. Having the flexible thermal busbar connections between the cold portions of the cryocooler penetration assembly and the cold portions of the first superconducting coil assembly minimizes the transfer of vibrations from the cryocooler coldhead (which is attached to the cryocooler penetration assembly) to the superconducting coil assembly's thermal shield and magnet cartridge. Such minimization of transferred vibrations yields improved image quality of the MRI diagnostic system.

BRIEF DESCRIPTION OF THE DRAWINGS

The accompanying drawings illustrate a preferred embodiment of the present invention wherein.

DETAILED DESCRIPTION OF THE INVENTION

Figure 1:
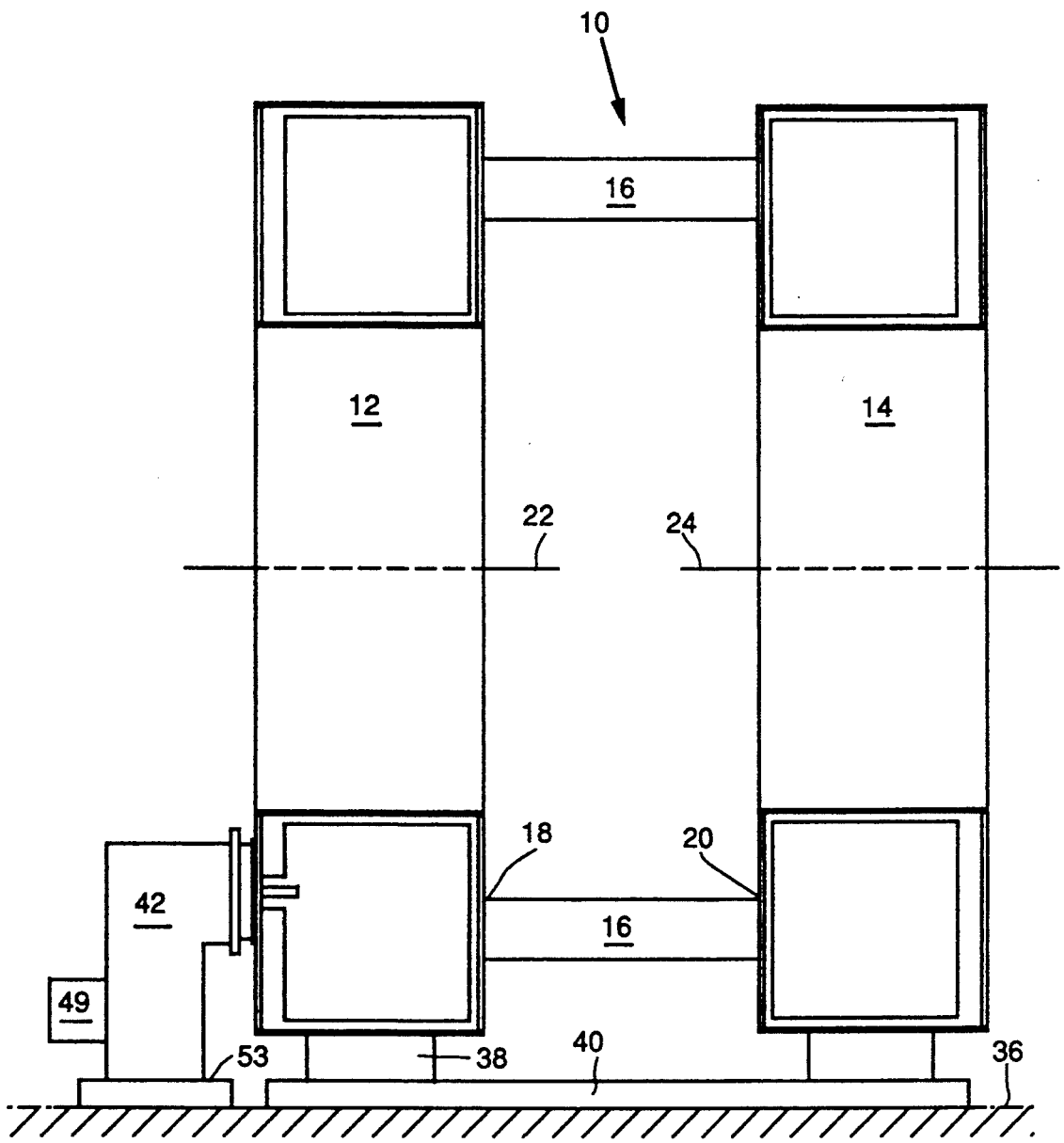
FIG. 1 is a schematic side elevational view of an open MRI magnet including two superconducting coil assemblies and a cryocooler penetration assembly plus an attached cryocooler coldhead.
Figure 2:
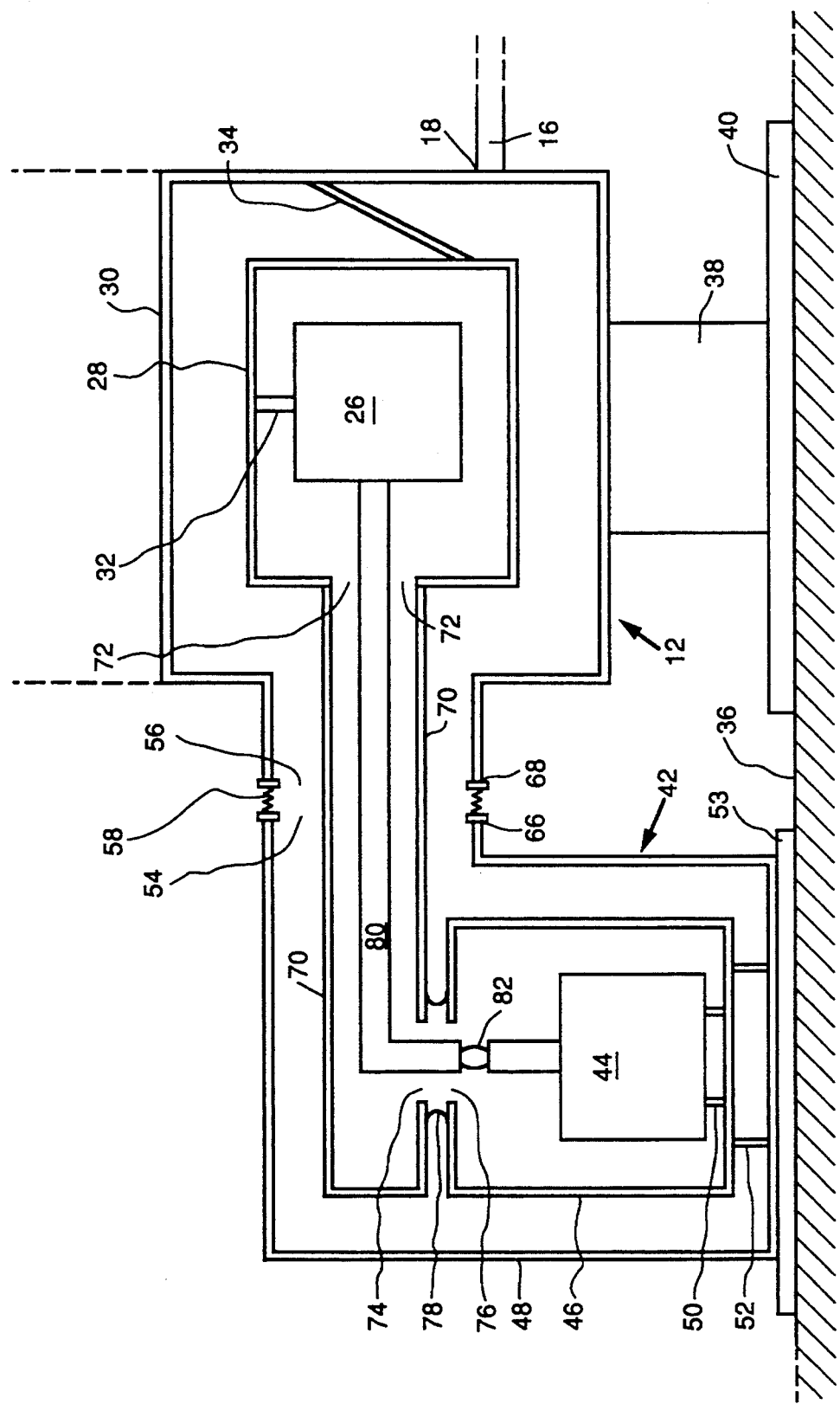
FIG. 2 is an enlarged detailed view of the lower left portion of FIG. 1 with the cryocooler coldhead omitted for clarity.
Figure 3:
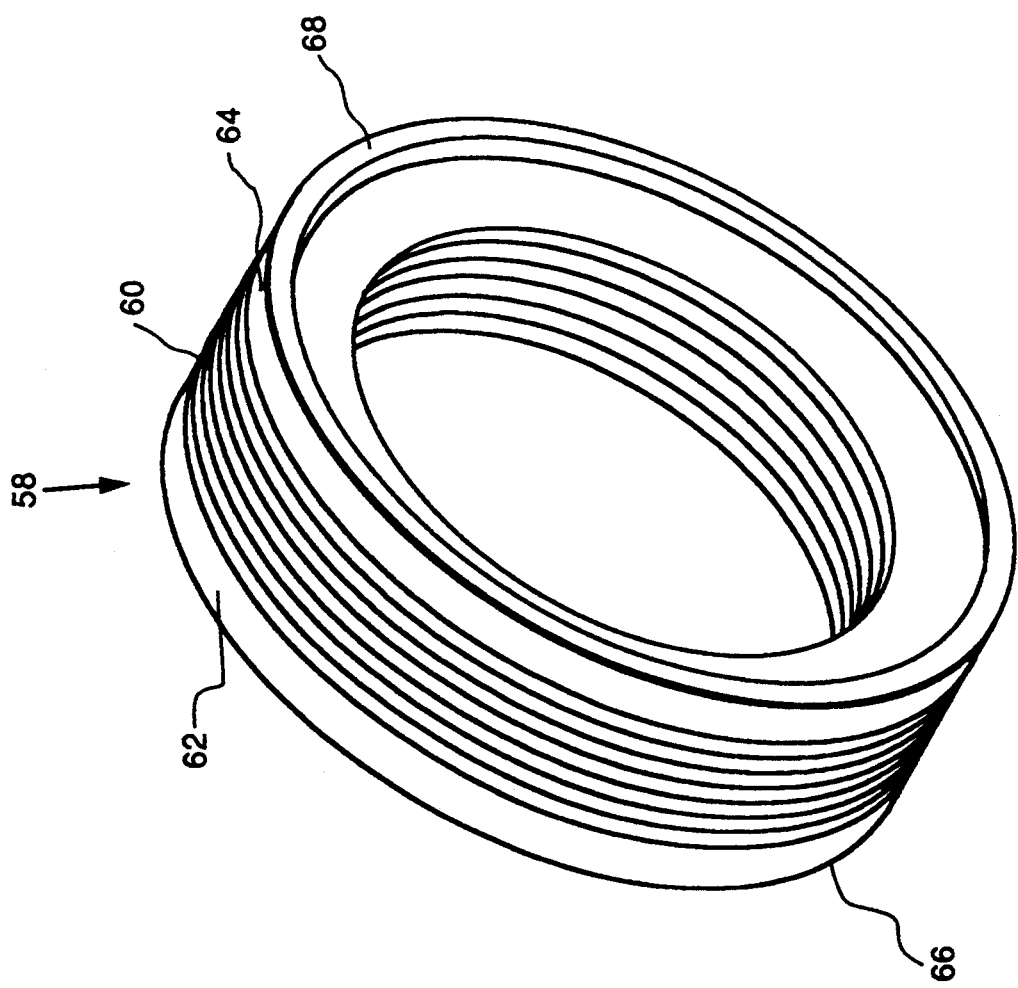
FIG. 3 is a perspective view of the flexible bellows which connects the vacuum vessel of the cryocooler penetration assembly and the vacuum enclosure of the first superconducting coil assembly.

Referring now to the drawings, wherein like numerals represent like elements throughout, FIGS. 1–3 show the magnetic resonance imaging (MRI) magnet 10 of the present invention. The magnet 10 includes first and second spaced-apart generally toroidal-shaped superconducting coil assemblies 12 and 14 and further includes a plurality of spaced-apart structural posts 16 each having a first end portion 18 attached to the first superconducting coil assembly 12 and each having a second end portion 20 attached to the second superconducting coil assembly 14. The longitudinal axis 22 of the first superconducting coil assembly 12 is generally coaxially aligned with the longitudinal axis 24 of the second superconducting coil assembly 14. Although the magnet 10 shown in the figures is of an open magnet design, the invention is equally applicable to closed or other magnet designs.

The first superconducting coil assembly has a generally toroidal-shaped magnet cartridge 26, a generally toroidal-shaped thermal shield 28, and a generally toroidal-shaped vacuum enclosure 30. The magnet cartridge 26 supports the superconductive coils (not shown). The thermal shield 28 is generally spaced apart from the magnet cartridge by supporting thermal insulating tubes 32 (only one of which is shown in the figures) and generally surrounds the magnet cartridge 26. The thermal insulating tubes 32 may be nonmagnetic stainless steel. The vacuum enclosure 30 is generally spaced apart from the thermal shield 28 by supporting tie rod straps 34 (only one of which is shown in the figures) and generally surrounds the thermal shield 28. The vacuum enclosure 30 is supported on a floor 36 through a cradle 38 and base plate 40 arrangement.

The magnet 10 also includes a cryocooler penetration assembly 42 which has a thermal station 44, a thermal box 46, and a vacuum vessel 48. The magnet 10 further includes a cryocooler, such as a conventional Gifford-McMahon cryocooler, including a cryocooler coldhead 49 which has first and second stages (not shown in the figures). The thermal station 44 is in thermal contact with, and preferably is maintained at generally ten degrees Kelvin by, the second stage of the cryocooler coldhead 49, such thermal contact being conventional and not shown in the figures. The thermal box 46 is generally spaced apart from the thermal station 44 by supporting thermal insulating tubes 50 and generally surrounds the thermal station 44. The thermal box 46 is in thermal contact with the first stage of the cryocooler coldhead 42 and preferably is maintained at generally forty degrees Kelvin, such thermal contact being conventional and not shown in the figures. The vacuum vessel 48 is generally spaced apart from the thermal box 46 by supporting thermal insulating tubes 52 and generally surrounds the thermal box 46. Preferably, the cryocooler penetration assembly 42 is disposed such that the weight of the cryocooler penetration assembly 42 is supported independent of the first superconducting coil assembly 12, such as by being disposed on the floor 36. As seen from FIG. 2, in an exemplary embodiment, the vacuum vessel 48 of the cryocooler penetration assembly 42 is disposed on the floor 36 through a base plate 53. Alternatively, the vacuum vessel 48 may be supported by a wall or ceiling (not shown). As seen from FIG. 1, the cryocooler coldhead 49 is attached to, and preferably has its weight supported by, the cryocooler penetration assembly 42. More specifically, the room temperature housing of the cryocooler coldhead 49 is attached to the vacuum vessel 48 of the cryocooler penetration assembly 42.

The vacuum vessel 48 has a vacuum vessel opening 54, and the vacuum enclosure 30 has a vacuum enclosure opening 56 disposed proximate the vacuum vessel opening 54. A flexible bellows 58 surrounds the vacuum vessel opening 54 and the vacuum enclosure opening 56 and hermetically connects the vacuum vessel 48 and the vacuum enclosure 30 to maintain a vacuum environment within the vacuum vessel 48 and the vacuum enclosure 30. Preferably, as seen from FIGS. 2 and 3, the bellows 58 has a generally annular cylindrical shape, a flexible mid portion 60 with generally accordion-shaped corrugations, and two rigid ends 62 and 64 each attached to the mid portion 60. More particularly, one of the ends 62 has a flange 66 attached to the vacuum vessel 48, and the other of the ends 64 has a flange 68 attached to the vacuum enclosure 30. The attachments may be accomplished by welding.

A first rigid thermal busbar 70 surrounds a thermal shield opening 72, is rigidly attached to the thermal shield 28, and has an orifice 74 proximate a thermal box opening 76. A first flexible thermal busbar 78 thermally connects the thermal box 46 and the first rigid thermal busbar 70. Preferably, the first rigid thermal busbar 70 is generally spaced apart from the vacuum vessel 48 and the vacuum enclosure 30, the first rigid thermal busbar 70 extends through the vacuum enclosure opening 56 and the vacuum vessel opening 54, and the first flexible thermal busbar 78 is disposed within the vacuum vessel 48. The first flexible thermal busbar 78 can itself surround the orifice 74 and the thermal box opening 76. Alternatively, an arrangement of reflective foil sections (not shown) and first flexible thermal busbar sections can surround the orifice 74 and thermal box opening 76.

A second rigid thermal busbar 80 is rigidly attached to the magnet cartridge 26. A second flexible thermal busbar 82 connects the second rigid thermal busbar 80 and the thermal station 44. Preferably, the second rigid thermal busbar 80 is generally spaced apart from the first rigid thermal busbar 70 and the thermal box 46, the second rigid thermal busbar 80 extends through the orifice 74 and the thermal box opening 76, and the second flexible thermal busbar 82 is disposed within the thermal box 46.

Preferably, compressed indium gaskets are used in the interfaces between the flexible thermal busbars 78 and 82 and the rigid thermal busbars 70 and 80. In an exemplary embodiment, the flexible thermal busbars 78 and 82 are made from laminated oxygen-free-hard copper.

The present invention has described an MRI magnet 10 wherein the vibration inherent to the reciprocating cryogenic regenerator (not shown) in the cryocooler coldhead 49 is isolated from the superconducting coil assembly's magnet cartridge 26, thermal shield 28, and vacuum enclosure 30 for improved image quality. Without such isolation (i.e., without the flexible bellows 58, the first flexible thermal busbar 78, and the second flexible thermal busbar 82), cryocooler coldhead vibrations would be transferred by two paths to the first superconducting coil assembly 12. In one path, vibrations within the cryocooler coldhead 49 would be transferred directly by its second stage to the thermal station 44 to the second rigid thermal busbar 80 to the magnet cartridge 26 and then by the thermal insulating tubes 32 to the thermal shield 28 and then by the tie rod straps 34 to the vacuum enclosure 30. In the second path, vibrations within the cryocooler coldhead 49 would be transferred directly by its second stage to the thermal station 44 and then by the thermal insulating tubes 50 to the thermal box 46 and then by the thermal insulating tubes 52 to the vacuum vessel 48 and then directly to the vacuum enclosure 30 and then by the tie rod straps 34 to the thermal shield 28 and then by the thermal insulating tubes 32 to the magnet cartridge 26.

The MRI magnet design also provides (via the second flexible thermal busbar 82 and the second rigid thermal busbar 80) a very low thermal impedance connection between the thermal station 44 of the cryocooler penetration assembly 42 and the magnet cartridge 26 of the first superconducting coil assembly 12 to cool the magnet cartridge 26 below the critical temperature needed for superconductivity by conducting heat from the magnet cartridge 26 to the second stage of the cryocooler coldhead 49. The design further provides (via the first flexible thermal busbar 78 and the first rigid thermal busbar 70) a very low thermal impedance connection between the thermal box 46 of the cryocooler penetration assembly 42 and the thermal shield 28 of the first superconducting coil assembly 12.

The foregoing description of a preferred embodiment of the invention has been presented for purposes of illustration. It is not intended to be exhaustive or to limit the invention to the precise form disclosed, and obviously many modifications and variations are possible in light of the above teaching. It is intended that the scope of the invention be defined by the claims appended hereto.

We claim:

1. A magnetic resonance imaging magnet comprising:
   a) a cryocooler penetration assembly including:
      (1) a thermal station;
      (2) a thermal box generally spaced apart from and generally surrounding said thermal station, said thermal box having a thermal box opening; and
      (3) a vacuum vessel generally spaced apart from and generally surrounding said thermal box, said vacuum vessel having a vacuum vessel opening;
   b) a first superconducting coil assembly including:
      (1) a magnet cartridge;
      (2) a thermal shield generally spaced apart from and generally surrounding said magnet cartridge, said thermal shield having a thermal shield opening; and
      (3) a vacuum enclosure generally spaced apart from and generally surrounding said thermal shield, said vacuum enclosure having a vacuum enclosure opening disposed proximate said vacuum vessel opening;
   c) a flexible bellows surrounding said vacuum vessel opening and said vacuum enclosure opening and hermetically connecting said vacuum vessel and said vacuum enclosure;
   d) a first rigid thermal busbar surrounding said thermal shield opening, rigidly attached to said thermal shield, and having an orifice proximate said thermal box opening;
   e) a first flexible thermal busbar thermally connecting said thermal box and said first rigid thermal busbar;
   f) a second rigid thermal busbar rigidly attached to said magnet cartridge; and
   g) a second flexible thermal busbar thermally connecting said second rigid thermal busbar and said thermal station.

2. The magnet of claim 1, also including a second superconducting coil assembly spaced apart from said first superconducting coil assembly and further including a plurality of spaced-apart structural posts each having a first end portion attached to said first superconducting coil assembly and each having a second end portion attached to said second superconducting coil assembly.

3. The magnet of claim 1, wherein said cryocooler penetration assembly is disposed such that the weight of said cryocooler penetration assembly is supported independent of said first superconducting coil assembly.

4. The magnet of claim 3, wherein said cryocooler penetration assembly is disposed on a floor.

5. The magnet of claim 1, wherein said first rigid thermal busbar is generally spaced apart from said vacuum vessel and said vacuum enclosure.

6. The magnet of claim 5, wherein said second rigid thermal busbar is generally spaced apart from said first rigid thermal busbar and said thermal box.

7. The magnet of claim 6, wherein said first rigid thermal busbar extends through said vacuum enclosure opening and said vacuum vessel opening and wherein said first flexible thermal busbar is disposed within said vacuum vessel.

8. The magnet of claim 7, wherein said second rigid thermal busbar extends through said orifice and said thermal box opening and wherein said second flexible thermal busbar is disposed within said thermal box.

9. The magnet of claim 1, wherein said bellows has a generally annular cylindrical shape, a flexible mid portion having generally accordion-shaped corrugations, and two rigid ends each attached to said mid portion.

10. The magnet of claim 9, wherein one of said ends has a flange attached to said vacuum vessel and wherein the other of said ends has a flange attached to said vacuum enclosure.

* * * * *